United States Patent
Garoni et al.

(10) Patent No.: US 11,728,462 B2
(45) Date of Patent: Aug. 15, 2023

(54) OPTOELECTRONIC DEVICE COMPRISING AN ARRAY OF PHOTOLUMINESCENT BLOCKS AND METHOD FOR THE PRODUCTION OF SAME

(71) Applicant: Aledia, Echirolles (FR)

(72) Inventors: Eleonora Garoni, Grenoble (FR); Christophe Lincheneau, Grenoble (FR); Sylvia Scaringella, Montbonnot-Saint-Martin (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 17/312,886

(22) PCT Filed: Dec. 19, 2019

(86) PCT No.: PCT/FR2019/053223
§ 371 (c)(1),
(2) Date: Jun. 10, 2021

(87) PCT Pub. No.: WO2020/128376
PCT Pub. Date: Jun. 25, 2020

(65) Prior Publication Data
US 2021/0359170 A1    Nov. 18, 2021

(30) Foreign Application Priority Data
Dec. 20, 2018    (FR) ...................................... 1873474

(51) Int. Cl.
*H01L 33/50*    (2010.01)
(52) U.S. Cl.
CPC .... *H01L 33/504* (2013.01); *H01L 2933/0041* (2013.01)

(58) Field of Classification Search
CPC ........... H01L 33/504; H01L 2933/0041; H01L 33/508; H01L 33/501
See application file for complete search history.

(56) References Cited

U.S. PATENT DOCUMENTS

2012/0200219 A1*  8/2012  Song .................... B82Y 20/00
                                                  445/24
2014/0124802 A1    5/2014  Do et al.
(Continued)

FOREIGN PATENT DOCUMENTS

WO    WO 2018/219199 A1    12/2018

OTHER PUBLICATIONS

International Preliminary Report on Patentability for International Application No. PCT/FR2019/053223, dated Jul. 1, 2021.
(Continued)

*Primary Examiner* — Sarah K Salerno
(74) *Attorney, Agent, or Firm* — Wolf, Greenfield & Sacks, P.C.

(57) ABSTRACT

An optoelectronic device including a support, at least hydrophilic photoluminescent blocks including hydrophilic photoluminescent particles covering first areas of the support and hydrophobic photoluminescent blocks including hydrophobic photoluminescent particles covering second areas of the support, the hydrophilic photoluminescent blocks being in contact with a hydrophilic material in the first areas and the hydrophobic photoluminescent blocks being in contact with a hydrophobic material in the second areas.

27 Claims, 6 Drawing Sheets

(56) References Cited

U.S. PATENT DOCUMENTS

2014/0131748 A1    5/2014  Song
2014/0203303 A1*   7/2014  Jiang .................. H01L 27/3283
                                                              438/29
2019/0214604 A1*   7/2019  Zhen .................. H01L 51/0005

OTHER PUBLICATIONS

International Search Report and Written Opinion for International Application No. PCT/FR2019/053223, dated Mar. 11, 2020.

* cited by examiner

OPTOELECTRONIC DEVICE COMPRISING AN ARRAY OF PHOTOLUMINESCENT BLOCKS AND METHOD FOR THE PRODUCTION OF SAME

This application is a national stage filing under 35 U.S.C. § 371 of International Patent Application Serial No. PCT/FR2019/053223, filed Dec. 19, 2019, which claims priority to French patent application number 18/73474, filed Dec. 20, 2018. The contents of these applications are incorporated herein by reference in their entireties.

TECHNICAL BACKGROUND

The present disclosure generally concerns optoelectronic devices comprising an array of photoluminescent blocks and methods of manufacturing the same, and more particularly optoelectronic devices capable of displaying images, particularly a display screen or an image projection device.

PRIOR ART

A pixel of an image corresponds to the unit element of the image displayed or captured by the optoelectronic device. For the display of color images, the optoelectronic device generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the optoelectronic device.

Each display sub-pixel may comprise a light source, for example, a light-emitting diode, covered with a photoluminescent block capable of converting the radiation supplied by the light-emitting diode into a radiation at the desired wavelength. Photoluminescent blocks of different types thus have to be formed according to the layout of the display sub-pixels. An example of a method of forming photoluminescent blocks comprises, for each type of photoluminescent block, depositing a layer of resist comprising photoluminescent particles of the given type and delimiting the photoluminescent blocks at the desired locations by photolithographic etch steps. A disadvantage of such a method is that the steps of photolithographic etching of all the different types of photoluminescent blocks require successively positioning a plurality of masks. However, the accurate positioning of a mask relative the optoelectronic device may be a difficult operation, particularly due to the fact that the resists filled with the photoluminescent particles may be only imperfectly transparent.

SUMMARY

Thus, an object of an embodiment is to at least partly overcome the disadvantages of the previously-described optoelectronic devices comprising an array of photoluminescent blocks.

Another object of an embodiment is to simplify the optoelectronic device manufacturing method.

Another object of an embodiment is for the optoelectronic device manufacturing method not to comprise a plurality of successive mask positioning steps.

Another object of an embodiment is for optoelectronic devices to be capable of being manufactured at an industrial scale and at a low cost.

An embodiment provides an optoelectronic device comprising a support, at least hydrophilic photoluminescent blocks comprising hydrophilic photoluminescent particles covering first areas of the support and hydrophobic photoluminescent blocks comprising hydrophobic photoluminescent particles covering second areas of the support, the hydrophilic photoluminescent blocks being in contact with a hydrophilic material in the first areas and the hydrophobic photoluminescent blocks being in contact with a hydrophobic material in the second areas.

An embodiment also provides a method of manufacturing an optoelectronic device, comprising the forming, on a support, of at least hydrophilic photoluminescent blocks comprising hydrophilic photoluminescent particles covering first areas of the support and of hydrophobic photoluminescent blocks comprising hydrophobic photoluminescent particles covering second areas of the support, the hydrophilic photoluminescent blocks being in contact with a hydrophilic material in the first areas and the hydrophobic photoluminescent blocks being in contact with a hydrophobic material in the second areas According to an embodiment, each hydrophilic photoluminescent block comprises at least one monolayer of said hydrophilic photoluminescent particles.

According to an embodiment, each hydrophobic photoluminescent block comprises at least one monolayer of said hydrophobic photoluminescent particles.

According to an embodiment, each hydrophilic photoluminescent block comprises a hydrophilic matrix having the hydrophilic photoluminescent particles dispersed therein.

According to an embodiment, each hydrophobic photoluminescent block comprises a hydrophobic matrix having the hydrophobic photoluminescent particles dispersed therein.

According to an embodiment, the hydrophilic material comprises first hydrophilic ligands, each comprising a hydrophilic chain, a first group at a first end of the hydrophilic chain, bonded to a hydroxy group at the support surface, and a second group at a second end of the hydrophilic chain, opposite to the first end, in contact with one of the hydrophilic photoluminescent blocks.

According to an embodiment, the second groups are bonded to some of said hydrophilic photoluminescent particles.

According to an embodiment, each hydrophilic photoluminescent block comprises a stack of layers of the hydrophilic photoluminescent particles and second hydrophilic ligands bonded to hydrophilic photoluminescent particles of different layers.

According to an embodiment, the hydrophobic material comprises first hydrophobic ligands, each comprising a hydrophobic chain, a third group at a third end of the hydrophobic chain, bonded to a hydroxy group at the support surface, and a fourth group at a fourth end of the hydrophobic chain in contact with one of the hydrophobic photoluminescent blocks.

According to an embodiment, the fourth groups are bonded to said hydrophobic photoluminescent particles.

According to an embodiment, each hydrophobic photoluminescent block comprises a stack of layers of the hydrophobic photoluminescent particles and second hydrophobic ligands bonded to hydrophobic photoluminescent particles of different layers.

According to an embodiment, the device comprises light-emitting diodes covered with the hydrophilic and hydrophobic photoluminescent blocks.

According to an embodiment, the method comprises, for the forming of the hydrophilic and hydrophobic photoluminescent blocks, a single step of exposure of the support to an electromagnetic radiation through a mask.

According to an embodiment, the method comprises steps of forming hydroxy groups at the second locations, of applying a first solution containing the first hydrophobic ligands on the first and second areas, of forming hydroxy groups at the second locations, of applying a second solution containing the first hydrophilic ligands on the first and second areas, of applying a third solution containing the hydrophilic photoluminescent particles on the first and second areas, and of applying a fourth solution containing the hydrophilic photoluminescent particles on the first and second areas.

According to an embodiment, the step of forming hydroxy groups at the second locations comprises exposing the support to an electromagnetic radiation in the absence of a mask.

According to an embodiment, the method comprises steps of forming hydroxy groups at the first locations, of applying a fourth solution containing precursors of the hydrophilic matrix and the hydrophilic photoluminescent particles, of forming the hydrophilic matrix having the hydrophilic photoluminescent particles dispersed therein, of applying a fifth solution containing precursors of the hydrophobic matrix and the hydrophobic photoluminescent particles, and of forming the hydrophobic matrix having the hydrophobic photoluminescent particles dispersed therein.

The foregoing and other features and advantages will be discussed in detail in the following non-limiting description of specific embodiments in connection with the accompanying drawings.

DESCRIPTION OF THE EMBODIMENTS

Figure 1:
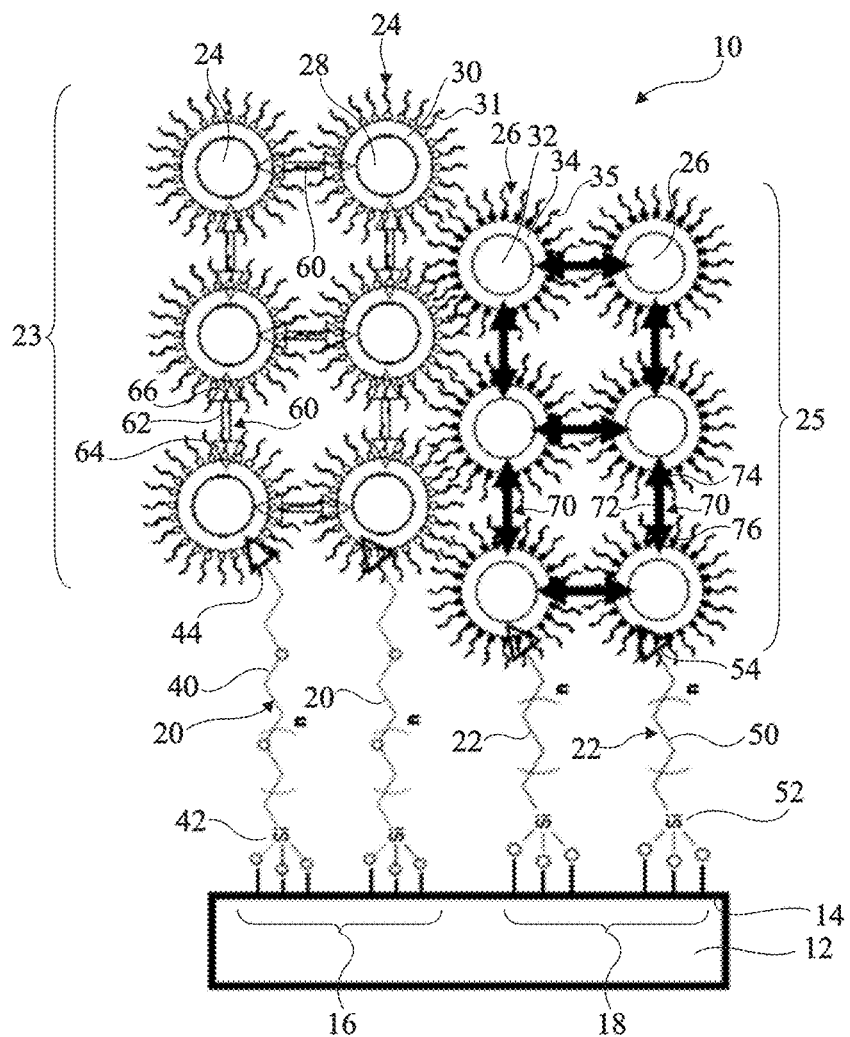
FIG. 1 is a partial simplified cross-section view of an embodiment of an optoelectronic device.

The same elements have been designated with the same reference numerals in the different drawings. In particular, the structural and/or functional elements common to the different embodiments may be designated with the same reference numerals and may have identical structural, dimensional, and material properties. For clarity, only those steps and elements which are useful to the understanding of the described embodiments have been shown and are detailed. The terms "about", "approximately", "substantially", and "in the order of" are used herein to designate a tolerance of plus or minus 10%, preferably of plus or minus 5%, of the value in question.

The term "particle" such as used in the context of the present disclosure should be understood in a broad sense and corresponds not only to compact particles having a more or less spherical shape but also to angular particles, to flattened particles, to flake-shaped particles, to fiber-shaped particles, or to fibrous particles, etc. It should be understood that the "size" of particles in the context of the present invention means the smallest transverse dimension of the particles. As an example, in the case of fiber-shaped particles, the particle size corresponds to the diameter of the fibers. Particles of a material means the particles considered individually (that is, the unit elements of the material), knowing that the material may appear in the form of particle clusters.

The term "average size" means according to the present invention the particle size which is greater than the size of 50% by volume of the particles and smaller than the size of 50% by volume of the particles of a particle distribution. This corresponds to d50. The particle size distribution of the particles may be measured by laser particle size analysis by using, for example, a Malvern Mastersizer 2000.

In the following description, a first material for which a drop of a liquid solution on a layer of the first material has a first static contact angle and a second material for which a drop of the liquid solution on a layer of the second material has a second static contact angle are considered, the first static contact angle being greater than the second static contact angle by at least 30 degrees, preferably by at least 40 degrees, more preferably by at least 50 degrees. The first material is said to be a stronger attractant for the liquid solution than the second material. In the following description, the term "material attractive for a liquid solution" designates a material for which the static contact angle of a drop of the liquid solution on the material is smaller than 90° and "material repulsive for a liquid solution" designates a material for which the static contact angle of a drop of the liquid solution on the material is greater than 90°. Generally, in the case of an aqueous solution, the attractant material is called hydrophilic material and the repulsive material is called hydrophobic material. However, in the following description, adjectives hydrophilic and hydrophobic are more generally used for the sake of simplicity. In particular, when a first material is called hydrophilic and a second material is called hydrophobic, this simply means that the first material is a stronger attractant than the second material for any liquid solution, particularly a non-aqueous liquid solution, and thus that the static contact angle of the liquid solution on a layer of the first material is greater than the static contact angle of the liquid solution on a layer of the second material by at least 30 degrees, preferably by at least 40 degrees, more preferably by at least 50 degrees. The measurement of the contact angle may be performed by using the measurement device commercialized by GBX under trade name Digidrop—MCAT. The measurement comprises the deposition of a drop of the considered liquid solution from 2 µl to 10 µl on a surface of the material to be studied, the acquisition of an image of the drop by an image acquisition device, and the determination of the contact angle by computer analysis of the acquired image.

FIG. 1 is a partial simplified cross-section view of an optoelectronic device 10. Optoelectronic device 10 comprises, from bottom to top in FIG. 1:

a support 12 having an upper surface 14 comprising first areas 16 and second areas 18, a single first area 16 and a single second area 18 being shown in FIG. 1;

first hydrophilic ligands 20 bonded to the first areas 16 of upper surface 14;

first hydrophobic ligands 22 bonded to the second areas 18 of upper surface 14;

first photoluminescent blocks 23 comprising first photoluminescent particles 24, distributed in a row of first photoluminescent particles 24 or in a stack of at least two rows of first photoluminescent particles 24, a block 23 of three rows of first photoluminescent particles 24 being shown in FIG. 1, the first photoluminescent particles 24 of the first row being bonded to hydrophilic ligands 20, the first photoluminescent particles 24 of the other rows being coupled to other first photoluminescent particles 24, possibly by second hydrophilic ligands 60; and second photoluminescent blocks 25 comprising second photoluminescent particles 26, distributed in a row of second photoluminescent particles 26 or in a stack of at least two rows of second photoluminescent particles 26, a block 25 of three rows of second photoluminescent particles 26 being shown in FIG. 1, the second photoluminescent particles 26 of the first row being bonded to the hydrophobic ligands 22, the second photoluminescent particles 26 of the other rows being coupled to other second photoluminescent particles 26, possibly by second hydrophobic ligands 70.

Optoelectronic device 10 may further comprise an electrically-insulating encapsulation layer, not shown, covering the entire structure that covers photoluminescent blocks 23, 25. The encapsulation layer may comprise a matrix transparent to the radiations emitted by photoluminescent blocks 23, 25. It for example is a polymer matrix, possibly photosensitive, particularly made of acrylate or siloxane polymer, for example, of poly(methyl methacrylate) (PMMA), a silicone matrix, or a silicon dioxide matrix, particularly formed by a sol-gel method. As a variation, the encapsulation layer may be formed by an atomic layer deposition (ALD) method. Titanium oxide ($TiO_2$) particles may be dispersed in the matrix to diffuse the radiations emitted by photoluminescent blocks 23, 25. As a variation, a layer of alumina ($Al_2O_3$) or of an $Al_2O_3/TiO_2$ mixture may be deposited as a protection of the matrix or in place thereof.

Support 12 corresponds to a layer of optoelectronic device 10. According to an embodiment, optoelectronic device 10 comprises an array of light-emitting diodes and support 12 corresponds to a dielectric layer covering the light-emitting diodes and being at least partly transparent to the radiation emitted by the light-emitting diodes. The light-emitting diodes may be planar light-emitting diodes where the light-emitting diodes are formed by a stack of substantially planar semiconductor layers. The light-emitting diodes may be three-dimensional light-emitting diodes where the active layer of each light-emitting diode is formed on a three-dimensional semiconductor element, for example, a microwire, a nanowire, a conical element, particularly a pyramid, or a frustoconical element.

According to an embodiment, each photoluminescent block 23, 25 is located opposite a light-emitting diode and forms a display sub-pixel with this light-emitting diode. Each photoluminescent block 23, 25 comprises luminophores capable, when they are excited by the light emitted by the associated light-emitting diode LED, of emitting light at a wavelength different from the wavelength of the light emitted by the associated light-emitting diode. According to an embodiment, each display pixel comprises at least two types of photoluminescent blocks 23, 25. The photoluminescent block 23 of the first type is capable of converting the radiation supplied by the light-emitting diodes into a first radiation at a first wavelength, and the photoluminescent block 25 of the second type is capable of converting the radiation supplied by the light-emitting diodes into a second radiation at a second wavelength.

According to an embodiment, the first wavelength corresponds to green light and is in the range from 510 nm to 570 nm. According to an embodiment, the second wavelength corresponds to red light and is in the range from 600 nm to 720 nm. Conversely, the first wavelength may correspond to red light and the second wavelength may correspond to green light. Light-emitting diodes LED are for example capable of emitting a radiation having a wavelength in the range from 300 nm to 500, or preferably from 400 nm to 480 nm.

Each first photoluminescent particle 24 comprises a core 28 of a first photoluminescent material surrounded with a first shell 30. First surface active agents 31 may be present at the surface of each first shell 30. Each second photoluminescent particle 26 comprises a core 32 of a second photoluminescent material surrounded with a second shell 34. Second surface active agents 35 may be present at the surface of each second shell 34. Each shell may have a uniform composition and comprise two or more than two substantially concentric layers having different compositions.

The dimensions of cores 28, 32 particularly depend on the nature of the first and second photoluminescent materials. The first photoluminescent material and the second photoluminescent material may each independently be an aluminate, a silicate, a nitride, a fluoride, or a sulfide. The average size of the first or second particles of such photoluminescent materials is in the range from 1 µm to 20 µm, preferably from 1 µm to 10 µm, more preferably from 1 µm to 8 µm.

According to an embodiment, the first photoluminescent material and the second photoluminescent material may each independently be an aluminate, particularly an yttrium aluminum garnet according to the following formula (1):

$$(Y_{3-x}R^1_x)(Al_{5-y}R^2_y)O_{12}$$

where R1 and R2 are independently selected from the elements comprising rare earths, alkaline earths, and transition metals and x and y each independently vary from 0 to 1.5, preferably from 0 to 1. Preferably, R1 and R2 are independently selected from the group comprising cerium, samarium, gadolinium, silicon, barium, terbium, strontium, chromium, praseodymium, gallium, europium, erbium, or ytterbium.

As an example of nitrides absorbing and emitting light in the desired wavelength ranges, $CaAlSiN_3$:Eu, (Ca,Sr)$AlSiN_3$:Eu, $Ca_2Si_5N_8$:Eu, or (Ca,Sr)$Si_5N_8$:Eu can be mentioned.

As an example of fluorides absorbing and emitting light in the desired wavelength ranges, fluorides of formula $K_2MF_6$:Mn (where M may be Si, Ge, Sn, or Ti), $NaYF_4$, $NaLnF_4$ (where Ln is a lanthanide, particularly Ce, Sm, Pr, Eu, Tb), $Ln^1_{1-x}Ln^2_xF_3$ (where $Ln^1$ and $Ln^2$ are rare earths) as well as their doped analogues, $NaYF_4$:$Ln^1$/$Ln^2$ and their analogues having a structure of core@shell type, particularly $NaYF_4$:$Ln^1$/$Ln^2$@$NaYF_4$, $Ln^1_{1-x}Ln^2_xF_3$@$NaYF_4$, can be mentioned.

As an example of sulfides absorbing and emitting light in the desired wavelength ranges, CaS:Eu, SrCa:Eu, (Sr,Ca)S:Eu, and $SrGa_2S_4$:Eu can be mentioned.

As an example of aluminate absorbing and emitting light in the desired wavelengths, $Y_3Al_5O_{12}$:Ce (also called YAG:Ce or YAG:$Ce^{3+}$), $(Y,Gd)_3Al_5O_{12}$:Ce, $Tb_3Al_5O_{12}$, $(Y,Tb)_3Al_5O_{12}$, $Lu_3Al_5O_{12}$:Ce, and $Y_3(Al,Ga)_5O_{12}$ can be mentioned.

As an example of silicates absorbing and emitting light in the desired wavelength ranges, $(Sr,Ba)_2SiO_4$:Eu, $Sr_2SiO_4$:Eu, $Ba_2SiO_4$:Eu, $Ca_2SiO_4$:Eu, $Ca_3SiO_5$:Eu, and $Sr_3SiO_5$:Eu can be mentioned.

According to an embodiment, each core 28 or 32 is of nanometer-range size and is made of a semiconductor material. Cores 28 or 32 are then called semiconductor nanocrystals. According to an embodiment, the average size of each semiconductor nanocrystal is in the range from 0.5 nm to 1,000 nm, preferably from 0.5 nm to 500 nm, more preferably still from 1 nm to 100 nm, particularly from 2 nm to 30 nm. For dimensions smaller than 50 nm, the photoconversion properties of semiconductor nanocrystals 28, 32 essentially depend on quantum confinement phenomena. The semiconductor nanocrystals 28, 32 then correspond to quantum dots. According to an embodiment, the semiconductor material of each semiconductor crystal 28, 32 is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide ($AgInS_2$), perovskites of $PbScX_3$ type where X is a halogen atom, particularly iodine (I), bromine (Br), or chlorine (Cl), $CuInS_2$, $CuInSe_2$, ZnInS, the previous materials doped with transition metals M (where M corresponds to Mn, Ag, As, Sb . . . ), particularly $Cd_{x-n}SeM_n$, CdSe:M, InP:M, ZnS:M, ZnInS:M, $CuInS_2$:M, $CuInSe_2$:M, particularly doped with Mn and Ag, ternary systems such as InPZn, systems such as InPZnS, InPZnAs (Sb, Ln), their doped derivatives such as for example InPZn:M, and a mixture of at least two of these compounds. According to an embodiment, the semiconductor material of the semiconductor nanocrystals is selected from the materials mentioned in Le Blevenec et al.'s publication in Physica Status Solidi (RRL)—Rapid Research Letters Volume 8, No. 4, pages 349-352, April 2014. According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are capable of converting blue light into red light and CdSe nanocrystals having an average size in the order of 1.3 nm are capable of converting blue light into green light. According to another embodiment, the composition of the semiconductor nanocrystals is selected according to the desired wavelength of the radiation emitted by the semiconductor nanocrystals.

Shells 30, 34 may be made of ZnS, ZnSe, CdS, or CdSe. The thickness of each shell 30, 34 may be in the range from 1 nm to 20 nm. As previously described, each shell may have a uniform composition and comprise two or more than two substantially concentric layers of different compositions, for example, CdSe/CdS/ZnS or InP/ZnSe/ZnS. According to an embodiment, the variation between the composition of the core and the composition of the shell is gradually achieved, the semiconductor nanocrystal being for example according to formula $Cd_{n-x}Se_{m-y}Zn_xS_y$, with x gradually varying from 0 at the center of the core to n in the shell and y varying from 0 at the center of the core to m in the shell.

According to an embodiment, the first and/or second photoluminescent particles comprise an external encapsulating shell made of oxide, such as for example $SiO_2$ or $TiO_2$, containing one, two, or more than two nanocrystals of the same type as those previously described.

The first photoluminescent particles 24 are hydrophilic. According to an embodiment, the hydrophilic character is at least partly due to the first surface active agents 31 at the surface of the shell 30 of each first photoluminescent particle 24. According to an embodiment, the first surface agents 31 may correspond to polyethylene glycol derivatives, carboxylate derivatives, particularly lipoic acid, amino acid derivatives, particularly cysteine or penicilline, saccharides, or saccharides modified with thiol and/or amino groups. Examples of first surface active agents are lipoic acid of formula $C_8H_{14}O_2S_2$ and dihydrolipoic acid of formula $C_8H_{16}O_2S_2$. The second photoluminescent particles 26 are hydrophobic. According to an embodiment, the hydrophobic character is at least partly due to the second surface active agents 35 present at the surface of the shell 34 of each second photoluminescent particle 26. According to an embodiment, second surface active agents 35 may correspond to hydrophobic ligands based on saturated or unsaturated aliphatic chains, branched or not, or based on polyaromatic chains. Generally, these may be ligands with a hydrophobic chain and an anchor head, for example, of general formula R—$(CH_2)_n$—$CH_3$ or R—$(CH_2)_n$—(CH=CH)$_m$—$CH_3$ or $CH_3(CH_2)_n$—CR($CH_2)_m CH_3$)—$(CH_2)_p CH_3$ with R equal to $COO^-$, $NH_2$, SH, P, or $PO_3$. Examples are octadecylamine (ODA) of formula $CH_3(CH_2)_{17}NH_2$, oleamine (OLA) of formula $CH_3(CH_2)_7CH=CH(CH_2)_7CH_2NH_2$, oleic acid (OA) of formula $CH_3(CH_2)_7CH=CH(CH_2)_7COOH$, hexadecylamine (HDA) of formula $CH_3(CH_2)_{15}NH_2$, trioctylphosphine (TOP) of formula $(CH_3(CH_2)_7)_3P$, trioctylphosphine oxide (TOPO) of formula $(CH_3(CH_2)_7)_3PO$, and dodecanethiol (DDT) of formula $CH_3(CH_2)_{11}SH$.

Each first hydrophilic ligand 20 corresponds to a molecule which is bonded to support 12 and to at least a first photoluminescent particle 24. Each molecule of hydrophilic ligand 20 comprises a central hydrophilic chain 40, a first group 42, capable of interacting with support 12, at a first end of chain 40 and a second group 44, capable of interacting with the first photoluminescent particles 24, at a second end of chain 40 opposite to the first end.

The central hydrophilic chain 40, linear or branched, may comprise a main chain made of a polyacrylate, a polyethylene glycol, a polyamide, a peptidic or polypeptidic chain, a saccharide, or a polysaccharide. Hydrophilic groups may be connected to the main chain to increase the hydrophilic character, for example, hydroxy, ketone, ammonium, carboxylate, phosphate, phosphite, phosphonate, sulfate, amide, and amine groups. The hydrophilic character is essentially provided to ligand 20 by chain 40.

First group 42 is a group capable of reacting with at least one hydroxy group, for example, to form a covalent bond with support 12. According to an embodiment, first group 42 comprises, before the bonding to support 12, at least one functional silyl ether chemical group, such as a tris-alkoxy silane, or an alkoxy group of formula —$OC_nH_{2n+1}$ where n is greater than 1, preferably between 1 and 5, for example, trimethoxysilane, triethoxysilane, tripropoxysilane, triisopropoxysilane, and tripopoxysilane. According to an embodiment, first group 42, before the reaction with hydroxy groups, is —$Si(CH_3O)_3$.

Second group 44 is a group capable of bonding to at least one first photoluminescent particle 24, for example, to shell 30 or to the surface active agents 31 covering the shell 30 of the first photoluminescent particle 24. The bond between second group 44 and first photoluminescent particle 24 or the surface active agents 31 covering first photoluminescent particle 24 may be a covalent bond, a metal-organic bond, or a weak interaction. Second group 44 may comprise, before the bonding to first photoluminescent particle 24, at least one functional chemical group corresponding to an amine, carboxylic, thiol, dithiol, trithiol, pyridinyle, phosphine, phosphine oxide (particularly when the first particle corresponds to a quantum dot), phosphonate, or phosphite group. When the surface of the first photoluminescent particles 24 is negatively charged, second group 44 may further comprise, before the bonding to the first photoluminescent particle 24, at least one positively charged group, such as an ammonium or pyridinium group.

Examples of hydrophobic ligands 20 have a general formula derived from general chemical formula $R(OCH_2-CH_2)_nSi(OC_mH_{2m+1})_3$ where R is one of the second previously-described groups, before the bonding to the first photoluminescent particle 24, particularly mercapto-mPEG5K-silane of formula $SH-CH_2O(CH_2CH_2O)_nCH_2CONHCH_2CH_2CH_2Si(OCH_2CH_3)_3$ or amino-mPEG5K-silane of formula $NH_2-CH_2O(CH_2CH_2O)_nCH_2CONHCH_2CH_2CH_2Si(OCH_2CH_3)_3$.

Each first hydrophobic ligand 22 corresponds to a molecule which is bonded to support 12 and to at least a second photoluminescent particle 26. Each molecule of hydrophobic ligand 22 comprises a central hydrophobic chain 50, a third group 52, capable of interacting with support 12, at a first end of chain 50, and a fourth group 54, capable of interacting with the second photoluminescent particles 26, at a second end of chain 50 opposite to the first end. Hydrophobic chain 50 may comprise a main carbon chain for example comprising from 2 to 20 carbon atoms. Alkyl groups may be bonded to the main chain to enhance the hydrophobic character. The hydrophobic character is mainly provided to ligand 22 by chain 50. Third group 52 is a group capable of reacting with at least one hydroxy group. Third group 52 may correspond to one of the examples previously described for first group 42. Fourth group 54 is a group capable of bonding to at least one second photoluminescent particle 26. The bond between fourth group 54 and second photoluminescent particle 26 or the surface active agents 35 covering second photoluminescent particle 26 may be a covalent bond, a metal-organic bond, or a weak interaction. Fourth group 54 may comprise at least one functional chemical group corresponding to an amine, phosphine, carboxylic acid, thiol, dithiol, trithiol, pyridinyle, phosphine, phosphine oxide (particularly when the first particle corresponds to a quantum dot), phosphonate, or phosphite, or alkyl group. When the surface of the second photoluminescent particles 26 is negatively charged, fourth group 54 may further comprise, before the bonding to the first photoluminescent particle 26, at least one positively charged group, such as an ammonium or pyridinium group.

Examples of hydrophobic ligands 22 are 3-aminopropyl(trimethoxysilane) of formula $H_2N(CH_2)_3Si(OCH_3)_3$, 3-mercaptopropyl(trimethoxysilane) of formula $HS(CH_2)_3Si(OCH_3)_3$, 3-aminopropyl(triethoxysilane) of formula $H_2N(CH_2)_3Si(OCH_2CH_3)_3$, 3-mercaptopropyl(triethoxysilane) of formula $HS(CH_2)_3Si(OCH_2CH_3)_3$, 4-aminobutyl(trimethoxysilane) of formula $H_2N(CH_2)_4Si(OCH_3)_3$, and 4-mercaptobutyl(trimethoxysilane) of formula $HS(CH_2)_4Si(OCH_3)_3$.

Each second hydrophobic ligand 60 comprises a central chain 62, a fifth group 64 at a first end of chain 62, and a sixth group 66 at a second end of chain 62, opposite to the first end. Central chain 62 may have the same structure as previously-described chain 20.

Each group 64, 66 is capable of bonding to a first photoluminescent particle 24. Each group 64, 66 may correspond to the previously-described second group 44. Further, ligands 60 may correspond to poly(ethylene glycol) diamines having —$(OCH_2CH_2O)_n$— units, where n is greater than 1, preferably in the range from 2 to 5 or poly(ethylene glycol)dithiols having —$(OCH_2CH_2O)_n$ units, where n is greater than 1, preferably in the range from 2 to 5.

Each second hydrophobic ligand 70 comprises a central chain 72, a seventh group 74 at a first end of chain 72, and an eighth group 76 at a second end of chain 72, opposite to the first end. Central chain 72 may have the same structure as previously-described chain 50. Central chain 72 may further correspond to a steroidic, polycyclohexane, adamantine chain and to Troger's bases, which are rigid hydrophobic components, which enables to keep a stable distance between the layers of photoluminescent particles 26 and between photoluminescent particles 26 themselves. Each group 74, 76 is capable of bonding to a second photoluminescent particle 26. Each group 74, 76 may correspond to the previously-described fourth group 54. Ligands 70 may correspond to diamines, such as 1,n-hexamthylenediamine where n is greater than 2, preferably in the range from 4 to 10; dithiols, such as 1,n-hexanedithiol where n is greater than 2, preferably in the range from 4 to 10.

FIGS. 2 to 12 each show, in their left-hand portion, a partial simplified perspective view of the optoelectronic device and, in their right-hand portion, a partial cross-section view of the optoelectronic device of the left-hand portion, at successive steps of an embodiment of the method of manufacturing the optoelectronic device 10 shown in FIG. 1.

Figure 2:
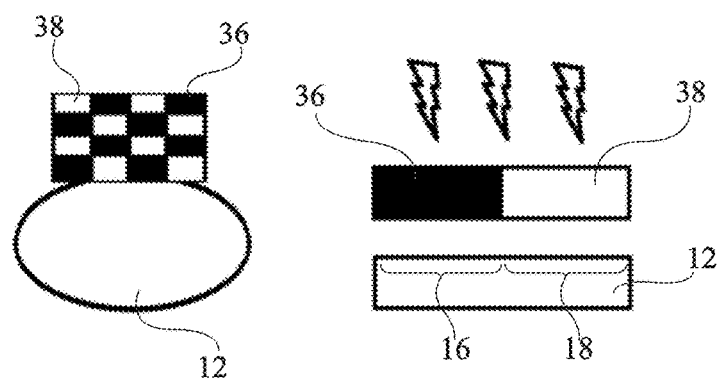
FIG. 2 illustrates a step of an embodiment of a method of manufacturing the optoelectronic device shown in FIG. 1.

FIG. 2 illustrates a step of exposure of support 12 to an electromagnetic radiation through a mask 36 comprising openings 38 to only expose second areas 18 to the electromagnetic radiation. Mask 36 is kept at a distance from support 12 during the exposure step. According to an embodiment, the electromagnetic radiation is an ultraviolet radiation in a wavelength range from 100 nm to 400 nm. The exposure time is in the range from 1 minute to 60 minutes. The energy fluence of the UV radiation may be in the range from 1 mJ/cm$^2$ to 1 J/cm$^2$. According to an embodiment, the exposure step is carried out in the presence of ozone.

Figure 3:
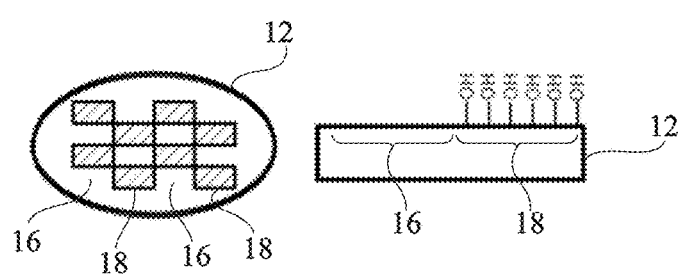
FIG. 3 illustrates another step of the manufacturing method.

FIG. 3 illustrates the structure obtained after the step previously described in relation with FIG. 2. Hydroxy groups (—OH) are bonded to support 12 only on the second areas 18 which have been exposed to the electromagnetic radiation.

Figure 4:
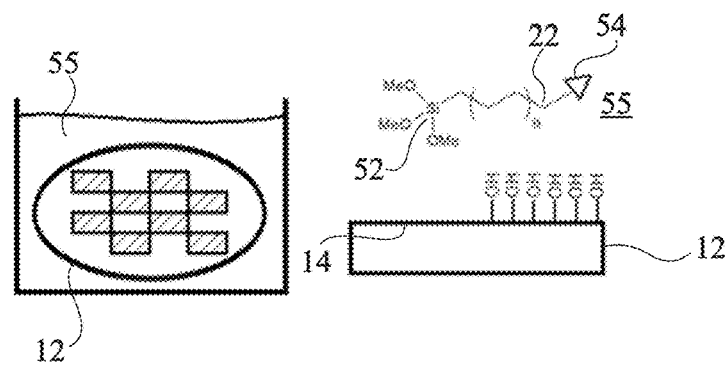
FIG. 4 illustrates another step of the manufacturing method.

FIG. 4 illustrates a step of dipping the structure shown in FIG. 3 into a solution 55 containing the first hydrophobic ligands 22. The duration of the dipping step may be in the range from 30 minutes to 1 month. The solvent of solution 55 may be an aromatic or aliphatic organic solvent. The solvent of solution 55 may be selected from the group comprising toluene, benzene, hexane, pentane, and petroleum ether. The concentration of the first hydrophobic ligands 22 in the solution may be greater than 10 mM, preferably from 40 mM to 1,000 mM. The dipping step may be followed by a step of rinsing support 12, particularly with the solvent of solution 55.

Figure 5:
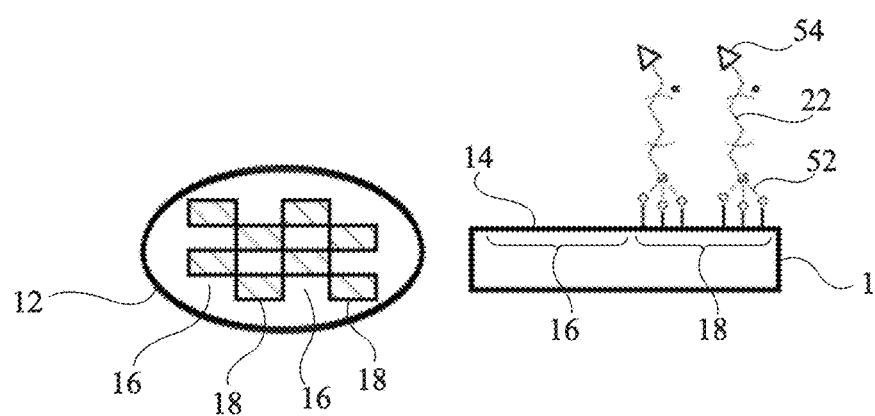
FIG. 5 illustrates another step of the manufacturing method.

FIG. 5 illustrates the structure obtained after the step previously described in relation with FIG. 4. The third group 52 of each hydrophobic ligand 22 has reacted with at least one hydroxy group and has bonded to the upper surface 14 of support 12. Hydrophobic ligands 22 are thus bonded to support 12 only on second areas 18 and are not present on first areas 16.

Figure 6:
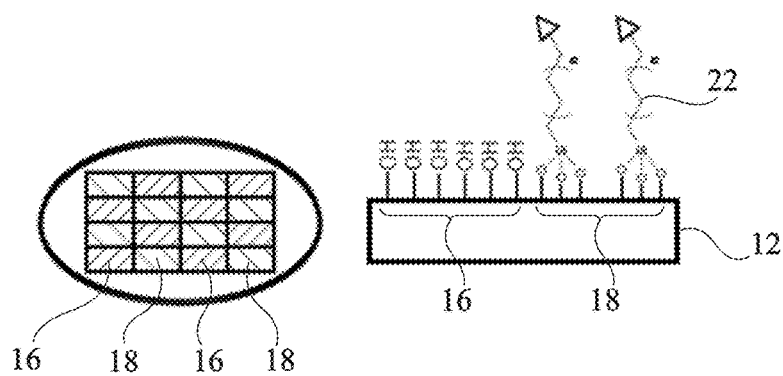
FIG. 6 illustrates another step of the manufacturing method.

FIG. 6 illustrates the structure obtained after a step of exposure of the structure shown in FIG. 5 to an electromagnetic radiation in the presence of a plasma. The characteristics of the electromagnetic radiation may be the same as those previously described at the exposure step previously described in relation with FIG. 2. The bonding of hydroxy groups to the first areas 16 is obtained. The hydrophobic ligands 22 are not modified at this step. Advantageously, the exposure step may be carried out without a mask.

Figure 7:
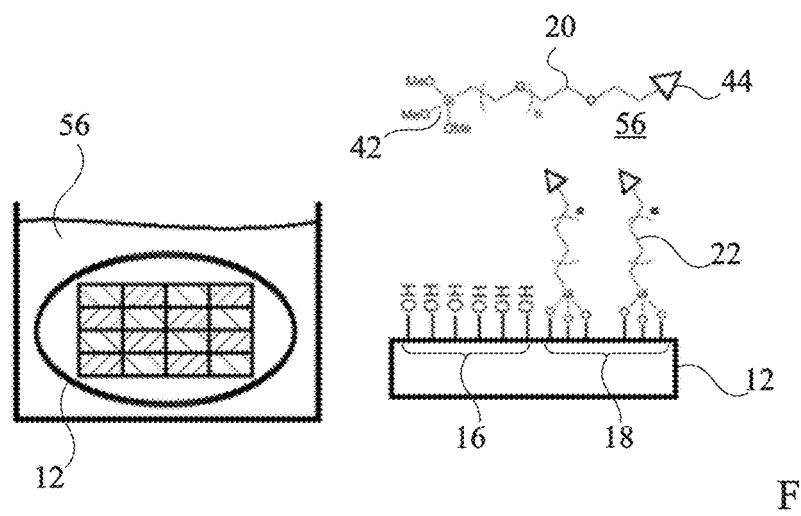
FIG. 7 illustrates another step of the manufacturing method.

FIG. 7 illustrates a step of dipping of the structure shown in FIG. 6 in a solution 56 containing the first hydrophilic ligand 20. The duration of the dipping step may be in the range from 30 minutes to 1 month. The solvent of solution 56 may be any hydrophilic or amphiphilic solvent. The solvent of solution 56 may be selected from the group comprising alcohols, particularly ethanol or methanol, propylene glycol monomethylic ether acetate (PGMEA), ethyl acetate, dimethylformamide (DMF), dimethylsulfoxide (DMSO), and water. The concentration of the first hydrophilic ligand 20 in the solution may be greater than 10 mM, preferably from 40 mM to 1,000 mM. The dipping step may be followed by a step of rinsing support 12, particularly with the solvent of solution 56.

Figure 8:
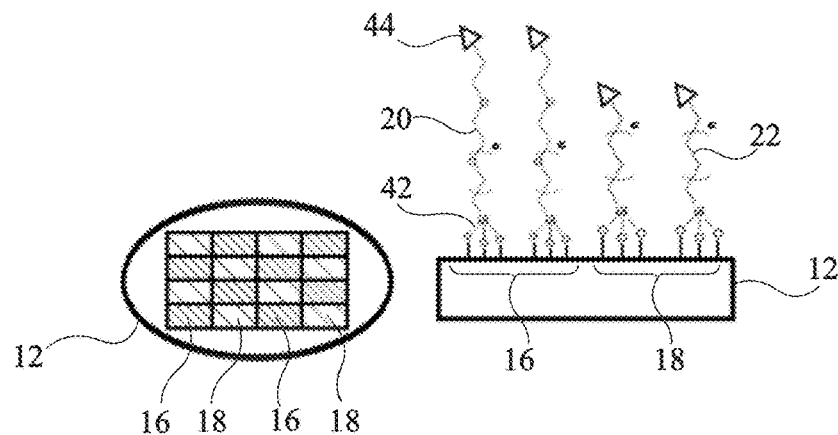
FIG. 8 illustrates another step of the manufacturing method.

FIG. 8 illustrates the structure obtained after the step previously described in relation with FIG. 7. The first group 42 of each hydrophilic ligand 20 has reacted with at least one hydroxy group and has bonded to the upper surface 14 of support 12. The hydrophilic ligands 20 are thus bonded to support 12 only on first areas 16 and are not present on second areas 18. Therefore, hydrophilic ligands 20 are chased from second areas 18 due to the hydrophobic character of these areas 18. A support 12 which is hydrophilic at the level of each area 16 and which is hydrophobic at the level of each second area 18 is thus obtained. Preferably, the contact angle of a liquid solution on each first area is greater by at least 40° than the contact angle of the same liquid solution on each second area 18. An advantage of the present method is that the ligands are stable, so that the structure shown in FIG. 8 can be stored before carrying on the method with no degradation of the hydrophilic character of first areas 16 and of the hydrophobic character of second areas 18.

Figure 9:
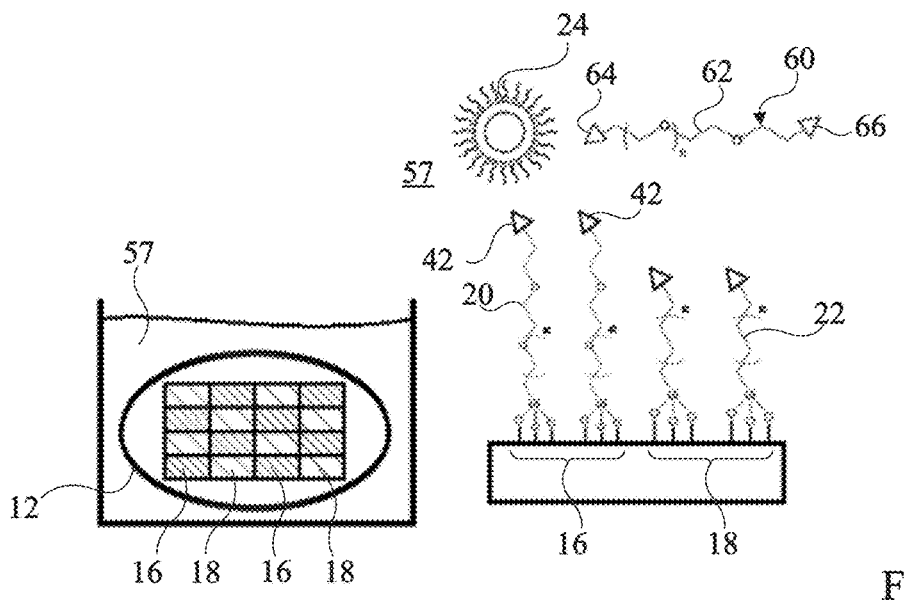
FIG. 9 illustrates another step of the manufacturing method.

FIG. 9 illustrates a step of dipping the structure obtained in FIG. 8 into a solution 57 containing first photoluminescent particles 24. First photoluminescent particles 24 bond to the first groups 42 of the first hydrophilic ligands 20 to form a monolayer of first photoluminescent particles 24. The first hydrophilic particles are further chased from second areas 18 due to the hydrophobic character of areas 18. The obtained structure may be removed from solution 57. The dipping step may be followed by a step of rising support 12, particularly with the solvent of solution 57 to remove the first photoluminescent particles 24 outside of first areas 16. The duration of the dipping step may be greater than 10 seconds, preferably in the range from 30 seconds to 5 minutes. The solvent of solution 57 may be selected from the group comprising alcohols, particularly ethanol or methanol, propylene glycol monomethylic ether acetate (PGMEA), ethyl acetate, dimethylformamide (DMF), dimethylsulfoxide (DMSO), and water. The concentration of the first photoluminescent particles 24 in solution 57 may be greater than 10 mM, preferably in the range from 10 mM to 1,000 mM.

If it is desirable to obtain a photoluminescent block 23 comprising a stack of a plurality of layers of first photoluminescent particles 24, the structure can then be dipped into a solution containing the second hydrophilic ligands 60. The obtained structure may then be rinsed in the solvent of the solution containing the second hydrophilic ligands 60 to remove all the ligands 60 present outside of first areas 16. The obtained structure may then be dipped again into solution 57 containing the first photoluminescent particles 24 to obtain the forming of a new monolayer of first photoluminescent particles 24 on the layer of first photoluminescent particles 24 already present. The obtained structure can then be rinsed in the solvent of the solution containing the first photoluminescent particles 24 to remove all the first photoluminescent particles 24 present outside of first areas 16. The operation of dipping into the solution comprising second hydrophilic ligands 60 and of dipping into the solution 57 containing the first photoluminescent particles 24 is repeated as many times as necessary to obtain the desired number of layers forming photoluminescent block 23.

Figure 10:
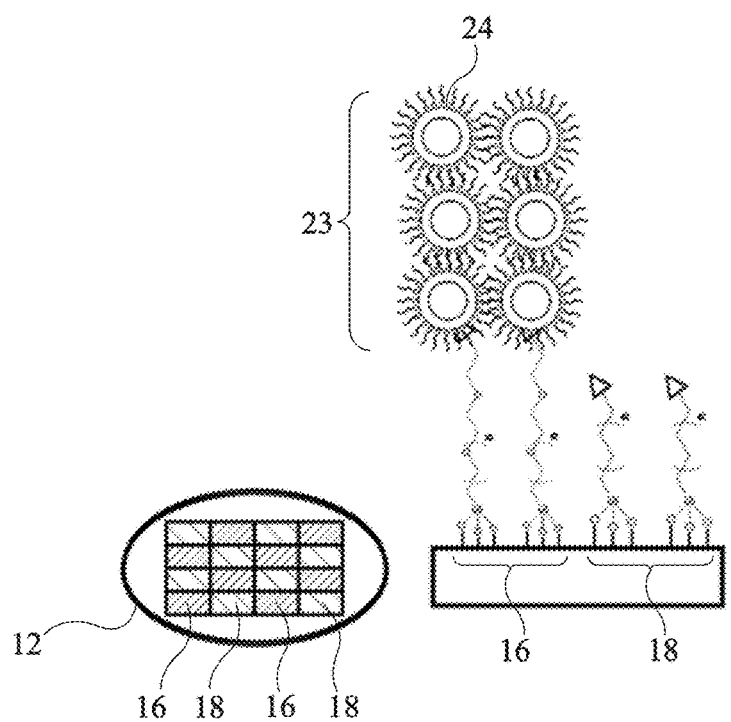
FIG. 10 illustrates another step of the manufacturing method.

FIG. 10 shows the structure obtained in the case where each photoluminescent block 23 comprises a stack of three monolayers of first photoluminescent particles 24, while the second hydrophilic ligands 60 are not shown in FIG. 10.

Figure 11:
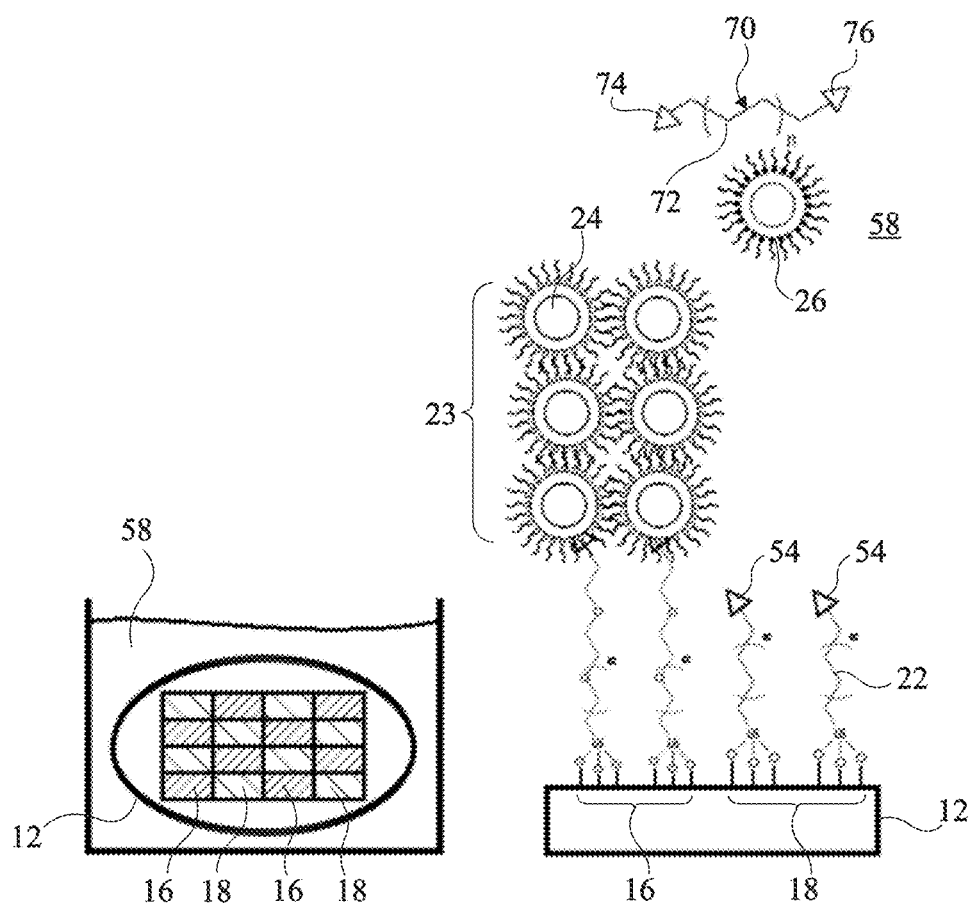
FIG. 11 illustrates another step of the manufacturing method.

FIG. 11 illustrates a step of dipping the structure obtained in FIG. 10 into a solution 58 containing second photoluminescent particles 26. Second photoluminescent particles 26 bond to the fourth groups 54 of the first hydrophobic ligands 22 to form a monolayer of second photoluminescent particles 26. The obtained structure may be removed from solution 58. The dipping step may be followed by a step of rising support 12, particularly with the solvent of solution 58 to remove the second photoluminescent particles 26 outside of second areas 18. The duration of the dipping step may be greater than 10 seconds, preferably in the range from 30 seconds to 5 minutes. The solvent of solution 58 may be an aromatic or aliphatic organic solvent. The solvent of solution 58 may be selected from the group comprising toluene, benzene, hexane, pentane, and petroleum ether. The concentration of the second photoluminescent particles 26 in solution 58 may be greater than 10 mM, preferably from 10 mM to 1,000 mM.

If it is desirable to obtain a photoluminescent block 25 comprising a stack of a plurality of layers of second photoluminescent particles 26, the structure can then be dipped into a solution containing the second hydrophobic ligands 70. The obtained structure may then be rinsed in the solvent of the solution containing the second hydrophobic ligands 70 to remove all the ligands 70 present outside of second areas 18. The obtained structure may then be dipped again into the solution 58 containing the second photoluminescent particles 26 to obtain the forming of a new monolayer of second photoluminescent particles 26 on the layer of second photoluminescent particles 26 already present. The obtained structure can then be rinsed in the solvent of the solution 58 containing the second photoluminescent particles 26 to remove all the second photoluminescent particles 26 present outside of second areas 18. The operation of dipping into the solution comprising second hydrophobic ligands 70 and of dipping into the solution 58 containing the second photoluminescent particles 26 is repeated as many times as necessary to obtain the desired number of layers forming photoluminescent block 25.

Figure 12:
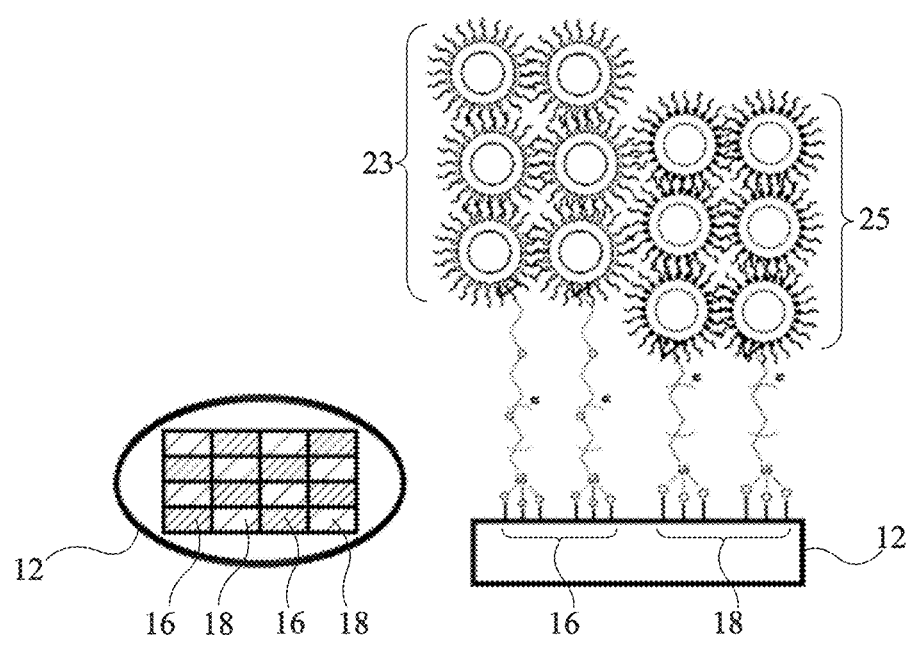
FIG. 12 illustrates another step of the manufacturing method.

FIG. 12 shows the structure obtained in the case where photoluminescent block 25 comprises a stack of three monolayers of second photoluminescent particles 26, while the second hydrophobic ligands 70 are not shown in FIG. 12.

According to another embodiment, the steps previously described in relation with FIGS. 2 to 5 may be implemented after the steps previously described in relation with FIGS. 6 to 8. Indeed, ligands 20 and 22 are designed to only interact with the areas 16 or 18 which have been previously activated, that is, for which hydroxy groups are present. It may however be advantageous to use the surface tension difference to ease the implementation of the method. If support 12 is initially hydrophobic, it may be advantageous to start with the bonding of hydrophilic ligands 20. Indeed, the solutions of ligands 20 and of first particles 24 are confined at hydrophilic functionalized surfaces 16, which enables to enhance the hydrophilic character of areas 16 and accordingly to ease the subsequent bonding of hydrophobic ligands 22. Similarly, if the wafer is initially hydrophilic, it may be easier to start with the bonding of hydrophobic ligands 22.

As a variation of each dipping step previously described in relation with FIGS. 4, 7, 9, and 11, hydrophobic ligands 22, hydrophilic ligands 20, first photoluminescent particles 24, and/or second photoluminescent particles 26 may be brought into contact with the structure obtained in FIG. 3, in particular deposited on the structure obtained in FIG. 3, for example by inkjet printing, heliography, silk-screening, flexography, spray coating, drop casting, spin coating, heliography, or blade coating.

Figure 13:
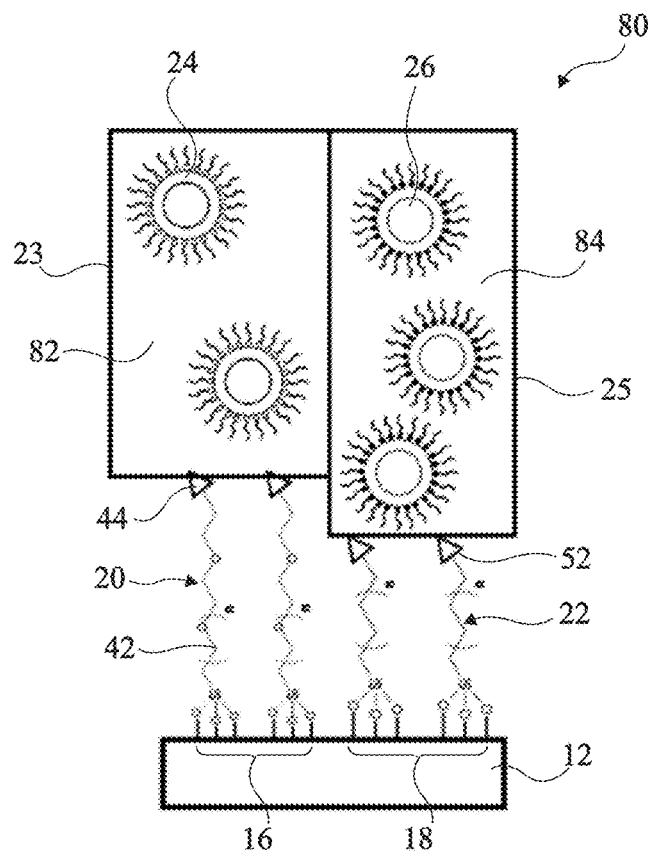
FIG. 13 is a partial simplified cross-section view of another embodiment of an optoelectronic device.

FIG. 13 is a partial simplified cross-section view of another embodiment of an optoelectronic device 80. Optoelectronic device 80 comprises all the elements of the optoelectronic device 10 shown in FIG. 1, with the difference that photoluminescent block 23 comprises a first matrix 82 having the first photoluminescent particles 24 dispersed therein and that photoluminescent block 25 comprises a second matrix 84 having the second photoluminescent particles 26 dispersed therein.

The first or second matrix 82, 84 is made of a material at least partly transparent to the radiation emitted by the light-emitting diodes and to the radiations emitted by the first and second photoluminescent particles 24, 26. According to an embodiment, the first and/or second matrix 82, 84 has an acrylate, PMMA, silicone, siloxane, or epoxy base. The first matrix 82 may be made of a hydrophilic material and the second matrix 84 may be made of a hydrophobic material. According to an embodiment, each first block 23 contains from 2 wt. % to 90 wt. %, preferably from 10 wt. % to 60 wt. % of first photoluminescent particles 24, for example, approximately 30 wt. % of first photoluminescent particles 24. According to an embodiment, each second block 25 contains from 2 wt. % to 90 wt. %, preferably from 10 wt. % to 60 wt. % of second photoluminescent particles 26, for example, approximately 30 wt. % of second photoluminescent particles. Each first or second block 23, 25 may further comprise $TiO_2$ particles.

An embodiment of a method of manufacturing the optoelectronic device 80 shown in FIG. 13 comprises all the steps of the embodiment of the method of manufacturing the optoelectronic device 10 shown in FIG. 1, previously described in relation with FIGS. 2 to 12, with the difference that, at the dipping step previously described in relation with FIG. 9, the structure shown in FIG. 8 is dipped into a solution containing precursors of first matrix 82 and the first photoluminescent particles 24 and that, at the dipping step previously described in relation with FIG. 11, the structure shown in FIG. 10 is dipped into a solution containing precursors of the second matrix 84 and the second photoluminescent particles 26.

At the step of dipping the structure shown in FIG. 8 into the solution containing the precursors of the first matrix 82 and the first photoluminescent particles 24, when the structure is removed from the dipping bath, the solution only remains on the first areas 16, given the hydrophobic character of second areas 18. The dipping step is followed by a drying or crosslinking step which results in the forming of first matrix 82 trapping the first photoluminescent particles 24 and thus in the forming of first photoluminescent blocks 23.

At the step of dipping the structure shown in FIG. 11 into the solution containing the precursors of the second matrix 84 and the second photoluminescent particles 26, when the structure is removed from the dipping bath, the solution only remains on the second areas 18, given the hydrophilic character of first areas 16. The dipping step is followed by a drying or crosslinking step which results in the forming of second matrix 84 trapping the second photoluminescent particles 26, and thus in the forming of second photoluminescent blocks 25.

According to an embodiment, the first and second matrices 82, 84 are made of the same general family of materials, for example, acrylates. However, matrix 82 and/or matrix 84 are modified to give a hydrophilic character to matrix 82 and a hydrophobic character to matrix 84. As an example, when matrices 82, 84 are based on acrylates, matrix 82 may be modified with the addition of hydroxyl or carboxylate functions to give it a hydrophilic character.

Figure 14:
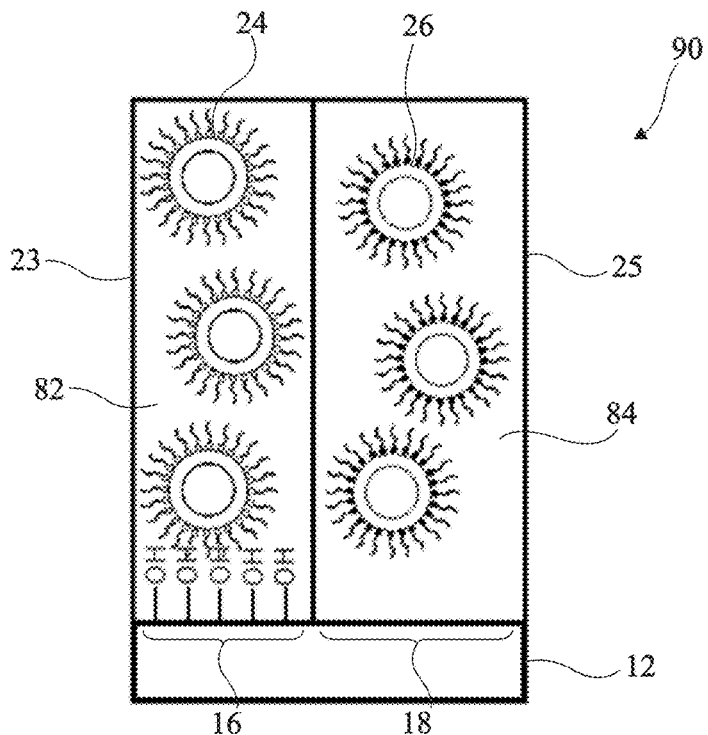
FIG. 14 is a partial simplified cross-section view of another embodiment of an optoelectronic device.

FIG. 14 is a partial simplified cross-section view of another embodiment of an optoelectronic device 90. Optoelectronic device 90 comprises all the elements of the optoelectronic device 80 shown in FIG. 13, with the difference that the first hydrophilic ligands 20 and the first hydrophobic ligands 22 are not present, that the first hydrophilic areas 16 comprise hydroxy groups —OH at their surface, and that photoluminescent groups 23, 25 are in contact with support 12. Further, in the present embodiment, support 12 is made of a hydrophobic material so that the second areas 18 are hydrophobic without providing a specific treatment to make second areas 18 hydrophobic. As a variation, hydrophobic areas 16 may correspond to a layer covering support 12, made of a material different from the material forming support 12 and having a surface energy different from that of support 12 so that the static contact angle of a liquid solution on hydrophilic areas 16 is greater than the static contact angle of the liquid solution on support 12 by at least 30 degrees, preferably by at least 40 degrees, more preferably by at least 50 degrees.

Figure 15:
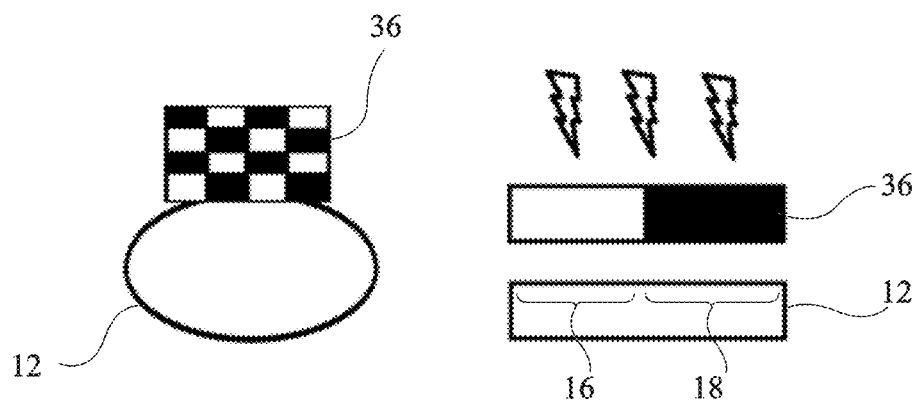
FIG. 15 illustrates a successive step of an embodiment of a method of manufacturing the optoelectronic device shown in FIG. 14.
Figure 16:
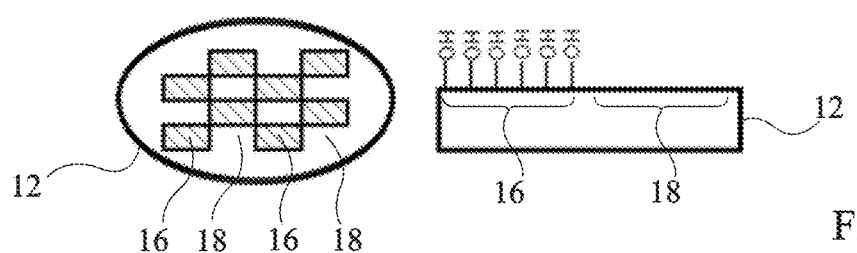
FIG. 16 illustrates another step of the manufacturing method.
Figure 17:
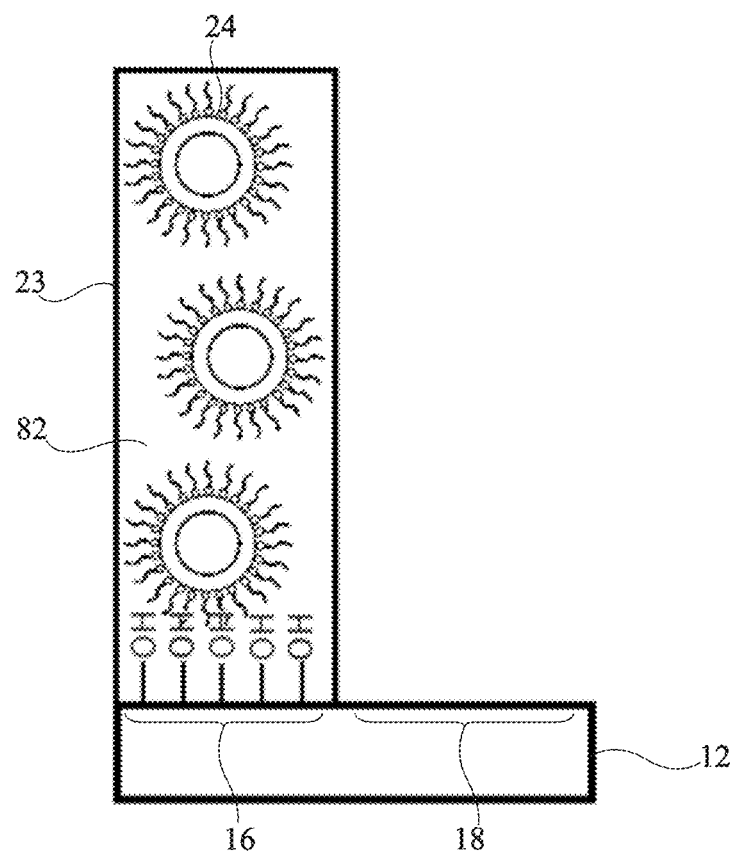
FIG. 17 illustrates another step of the manufacturing method.

FIGS. 15 to 17 each show, in their left-hand portion, a partial simplified perspective view of the optoelectronic device and, in their right-hand portion, a partial cross-section view of the device of the left-hand portion, at successive steps of an embodiment of the method of manufacturing the optoelectronic device 90 shown in FIG. 14.

FIG. 15 illustrates a step of exposure of support 12 similar to the step previously described in relation with FIG. 2, with the difference that the exposure to the radiation in the presence of an ozone plasma is applied to first areas 16.

FIG. 16 illustrates the structure obtained after the step previously described in relation with FIG. 15. Hydroxy groups (—OH) are bonded to support 12 only on the first areas 16 which have been exposed to the electromagnetic radiation.

FIG. 17 illustrates the structure obtained after a step of dipping the structure obtained in FIG. 16 into a solution containing the precursors of the first matrix 82 and the first photoluminescent particles 24, and a step of solidifying first matrix 82 to form first photoluminescent blocks 23. As the dipping step, first hydrophilic matrix 82 is only placed on first areas 16, which are hydrophilic due to the hydroxy functions while second areas 18 are hydrophobic.

The method then carries on with a step of dipping the structure obtained in FIG. 17 into a solution containing the precursors of the second matrix 84 and the second photoluminescent particles 26, and with a step of solidifying second matrix 84 to form second photoluminescent blocks 25. At the dipping step, second hydrophobic matrix 84 is only placed on second areas 18, which are hydrophobic while first photoluminescent blocks 82 are hydrophilic.

As a variation of the dipping steps previously described in relation with FIG. 17, the solution containing first matrix 82 and the first photoluminescent particles 24 and the solution containing second matrix 84 and the second photoluminescent particles 26 may be deposited, for example by inkjet printing, heliography, silk-screening, flexography, spray coating, drop casting, spin coating, heliography, or blade coating.

Various embodiments and variations have been described. It will be understood by those skilled in the art that certain features of these various embodiments and variations may be combined, and other variations will occur to those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An optoelectronic device comprising a support, at least hydrophilic photoluminescent blocks comprising hydrophilic photoluminescent particles covering first areas of the support and hydrophobic photoluminescent blocks comprising hydrophobic photoluminescent particles covering second areas of the support, the hydrophilic photoluminescent blocks being in contact with a hydrophilic material at the level of the first areas and the hydrophobic photoluminescent blocks being in contact with a hydrophobic material at the level of the second areas,
wherein the hydrophilic material comprises first hydrophilic ligands, each comprising a hydrophilic chain, a first group at a first end of the hydrophilic chain, bonded to a hydroxy group at the surface of the support, and a second group at a second end of the hydrophilic chain, opposite to the first end, in contact with one of the hydrophilic photoluminescent blocks.

2. The device of claim 1, wherein each hydrophilic photoluminescent block comprises at least one monolayer of said hydrophilic photoluminescent particles.

3. The device of claim 1, wherein each hydrophobic photoluminescent block comprises at least one monolayer of said hydrophobic photoluminescent particles.

4. The device of claim 1, wherein each hydrophilic photoluminescent block comprises a hydrophilic matrix having the hydrophilic photoluminescent particles dispersed therein.

5. The device of claim 1, wherein each hydrophobic photoluminescent block comprises a hydrophobic matrix having the hydrophobic photoluminescent particles dispersed therein.

6. The device of claim 1, wherein the second groups are bonded to said hydrophilic photoluminescent particles.

7. The device of claim 1, wherein each hydrophilic photoluminescent block comprises a stack of layers of the hydrophilic photoluminescent particles and second hydrophilic ligands bonded to hydrophilic photoluminescent particles of different layers.

8. The device of claim 1, comprising light-emitting diodes covered with hydrophilic and hydrophobic photoluminescent blocks.

9. The optoelectronic device of claim 1, wherein the hydrophilic photoluminescent blocks and the hydrophobic photoluminescent blocks are alternatingly disposed on the support.

10. The optoelectronic device of claim 1, wherein the hydrophilic photoluminescent blocks and the hydrophobic photoluminescent blocks are disposed on the support in a checkerboard.

11. An optoelectronic device comprising a support, at least hydrophilic photoluminescent blocks comprising hydrophilic photoluminescent particles covering first areas of the support and hydrophobic photoluminescent blocks comprising hydrophobic photoluminescent particles covering second areas of the support, the hydrophilic photoluminescent blocks being in contact with a hydrophilic material at the level of the first areas and the hydrophobic photoluminescent blocks being in contact with a hydrophobic material at the level of the second areas,
wherein the hydrophobic material comprises first hydrophobic ligands, each comprising a hydrophobic chain, a third group at a third end of the hydrophobic chain, bonded to a hydroxy group at the surface of the support, and a fourth group at a fourth end of the hydrophobic chain in contact with one of the hydrophobic photoluminescent blocks.

12. The device of claim 11, wherein the fourth groups are bonded to said hydrophobic photoluminescent particles.

13. The device of claim 11, wherein each hydrophobic photoluminescent block comprises a stack of layers of the hydrophobic photoluminescent particles and second hydrophobic ligands bonded to hydrophobic photoluminescent particles of different layers.

14. The device of claim 11, wherein each hydrophilic photoluminescent block comprises at least one monolayer of said hydrophilic photoluminescent particles.

15. The device of claim 11, wherein each hydrophobic photoluminescent block comprises at least one monolayer of said hydrophobic photoluminescent particles.

16. The device of claim 11, wherein each hydrophilic photoluminescent block comprises a hydrophilic matrix having the hydrophilic photoluminescent particles dispersed therein.

17. The device of claim 11, wherein each hydrophobic photoluminescent block comprises a hydrophobic matrix having the hydrophobic photoluminescent particles dispersed therein.

18. The device of claim 11, comprising light-emitting diodes covered with hydrophilic and hydrophobic photoluminescent blocks.

19. The optoelectronic device of claim 11, wherein the hydrophilic photoluminescent blocks and the hydrophobic photoluminescent blocks are alternatingly disposed on the support.

20. The optoelectronic device of claim 11, wherein the hydrophilic photoluminescent blocks and the hydrophobic photoluminescent blocks are disposed on the support in a checkerboard.

21. A method of manufacturing an optoelectronic device, including a support, at least hydrophilic photoluminescent blocks comprising hydrophilic photoluminescent particles covering first areas of the support and hydrophobic photoluminescent blocks including hydrophobic photoluminescent particles covering second areas of the support, the hydrophilic photoluminescent blocks being in contact with a hydrophilic material at the level of the first areas and the hydrophobic photoluminescent blocks being in contact with a hydrophobic material at the level of the second areas,
comprising the forming, on the support, of at least the hydrophilic photoluminescent blocks comprising the hydrophilic photoluminescent particles covering the first areas of the support and of the hydrophobic photoluminescent blocks comprising the hydrophobic photoluminescent particles covering the second areas of the support, the hydrophilic photoluminescent blocks being in contact with the hydrophilic material at the level of the first areas and the hydrophobic photoluminescent blocks being in contact with the hydrophobic material at the level of the second areas, and
comprising, for the forming of the hydrophilic and hydrophobic photoluminescent blocks, a single step of exposure of the support to an electromagnetic radiation through a mask.

22. A method of manufacturing an optoelectronic device, including a support, at least hydrophilic photoluminescent blocks comprising hydrophilic photoluminescent particles covering first areas of the support and hydrophobic photoluminescent blocks comprising hydrophobic photoluminescent particles covering second areas of the support, the hydrophilic photoluminescent blocks being in contact with a hydrophilic material at the level of the first areas and the hydrophobic photoluminescent blocks being in contact with a hydrophobic material at the level of the second areas,
comprising the forming, on the support, of at least the hydrophilic photoluminescent blocks comprising the hydrophilic photoluminescent particles covering the first areas of the support and of the hydrophobic photoluminescent blocks comprising the hydrophobic photoluminescent particles covering the second areas of the support, the hydrophilic photoluminescent blocks being in contact with the hydrophilic material at the level of the first areas and the hydrophobic photoluminescent blocks being in contact with the hydrophobic material at the level of the second areas,
wherein the hydrophilic material comprises first hydrophilic ligands, each comprising a hydrophilic chain, a first group at a first end of the hydrophilic chain, bonded to a hydroxy group at the surface of the support, and a second group at a second end of the hydrophilic chain, opposite to the first end, in contact with one of the hydrophilic photoluminescent blocks, wherein the hydrophobic material comprises first hydrophobic ligands, each comprising a hydrophobic chain, a third group at a third end of the hydrophobic chain, bonded to a hydroxy group at the surface of the support, and a fourth group at a fourth end of the hydrophobic chain in contact with one of the hydrophobic photoluminescent blocks, the method comprising steps of forming hydroxy groups in the second areas, of applying a first solution containing the first hydrophobic ligands on the first and second areas, of forming hydroxy groups in the second areas, of applying a second solution containing the first hydrophilic ligands on the first and second areas, of applying a third solution containing the hydrophilic photoluminescent particles on the first and second areas, and of applying a fourth solution containing the hydrophobic photoluminescent particles on the first and second areas.

23. The method of claim 22, wherein the step of forming hydroxy groups in the second areas comprises exposing the support to an electromagnetic radiation in the absence of a mask.

24. The method of claim 22 wherein the hydrophilic photoluminescent blocks and the hydrophobic photoluminescent blocks are disposed on the support in a checkerboard.

25. A method of manufacturing an optoelectronic device, including a support, at least hydrophilic photoluminescent blocks comprising hydrophilic photoluminescent particles covering first areas of the support and hydrophobic photoluminescent blocks comprising hydrophobic photoluminescent particles covering second areas of the support, the hydrophilic photoluminescent blocks being in contact with a hydrophilic material at the level of the first areas and the hydrophobic photoluminescent blocks being in contact with a hydrophobic material at the level of the second areas,
comprising the forming, on the support, of at least the hydrophilic photoluminescent blocks comprising the hydrophilic photoluminescent particles covering the first areas of the support and of the hydrophobic photoluminescent blocks comprising the hydrophobic photoluminescent particles covering the second areas of the support, the hydrophilic photoluminescent blocks being in contact with the hydrophilic material at the level of the first areas and the hydrophobic photoluminescent blocks being in contact with the hydrophobic material at the level of the second areas,
wherein each hydrophilic photoluminescent block comprises a hydrophilic matrix having the hydrophilic photoluminescent particles dispersed therein, wherein each hydrophobic photoluminescent block comprises a hydrophobic matrix having the hydrophobic photoluminescent particles dispersed therein, the method comprising steps of forming hydroxy groups in the first areas, of applying a fifth solution containing precursors of the hydrophilic matrix and the hydrophilic photoluminescent particles, of forming the hydrophilic matrix having the hydrophilic photoluminescent particles dispersed therein, of applying a sixth solution containing precursors of the hydrophobic matrix and the hydrophobic photoluminescent particles, and of forming the hydrophobic matrix having the hydrophobic photoluminescent particles dispersed therein.

26. The method of claim 25 wherein the hydrophilic photoluminescent blocks and the hydrophobic photoluminescent blocks are disposed on the support in a checkerboard.

27. The method of claim 21, wherein the hydrophilic photoluminescent blocks and the hydrophobic photoluminescent blocks are disposed on the support in a checkerboard.

* * * * *